(12) United States Patent
Freeman, Jr. et al.

(10) Patent No.: US 6,489,211 B1
(45) Date of Patent: Dec. 3, 2002

(54) METHOD OF MANUFACTURING A SEMICONDUCTOR COMPONENT

(75) Inventors: John L. Freeman, Jr., Mesa; Raymond J. Balda, Tempe; Robert A. Pryor, Mesa; James D. Paulsen, Tempe; Robert J. Johnsen, Scottsdale, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/516,349

(22) Filed: Mar. 1, 2000

(51) Int. Cl.[7] .............................. H01L 21/8238

(52) U.S. Cl. ..................... 438/322; 438/325; 438/327

(58) Field of Search ........................ 438/222, 309, 438/311, 353, 357, 358, 359, 360, 362

(56) References Cited

U.S. PATENT DOCUMENTS 5,067,002 A * 11/1991 Zdebel et al. ............... 257/756

* cited by examiner

Primary Examiner—David Nelms
Assistant Examiner—Dung Anh Le

(57) ABSTRACT

A method of manufacturing a semiconductor component includes providing a composite substrate (300) with a dielectric portion and a semiconductor portion and growing an epitaxial layer (400) over the composite substrate. The epitaxial layer has a polycrystalline portion (402) over the dielectric portion of the composite substrate and also has a monocrystalline portion (401) over the semiconductor portion of the composite substrate. A first dopant is diffused into the monocrystalline portion of the epitaxial layer to form an emitter region in the monocrystalline portion of the epitaxial layer while a second dopant is simultaneously diffused into the monocrystalline portion of the epitaxial layer to form an enhanced portion of the base region.

18 Claims, 4 Drawing Sheets

METHOD OF MANUFACTURING A SEMICONDUCTOR COMPONENT

RELATED APPLICATION

U.S. Pat. application No., 09/516,350, filed on the same date herewith and assigned to the same assignee, is a related application.

FIELD OF THE INVENTION

This invention relates, in general, to semiconductor devices and, more particularly, to a radio frequency bipolar transistor and method of manufacture thereof.

BACKGROUND OF THE INVENTION

For a transistor to operate efficiently at high frequencies, the transistor should have, among other characteristics, a small base transit time, a low intrinsic base resistance, and a small, linear extrinsic base-to-collector capacitance. Radio frequency (RF) bipolar transistors typically have a plurality of emitter finger regions in a common base well. The frequency response of these transistors is lithographically established by a width of the emitter region in the common base well. However, these transistors have a large base transit time, a high base resistance, and an excessive, non-linear extrinsic base-to-collector capacitance.

Accordingly, a need exists for a semiconductor component capable of operating efficiently at high frequencies. The bipolar transistors of the component should have smaller base transit times, lower intrinsic base resistances, and smaller, more linear extrinsic base-to-collector capacitances, when compared to the prior art.

BRIEF DESCRIPTION OF THE DRAWINGS

The present invention will be better understood from a reading of the following detailed description, taken in conjunction with the accompanying drawing figures in which.

Figure 1:
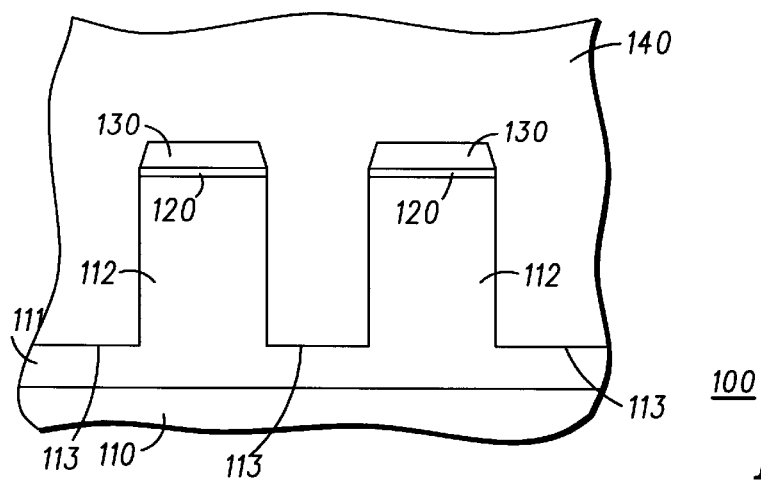
FIGS. 1–11 illustrate cross-sectional views of a portion of an embodiment of a semiconductor component during different stages of a manufacturing process in accordance with the present invention.

For simplicity and clarity of illustration, elements in the figures are not necessarily drawn to scale, and the same reference numerals in different figures denote the same elements. Additionally, descriptions and details of well-known features and processing techniques are omitted to avoid unnecessarily obscuring the present invention.

DETAILED DESCRIPTION OF THE DRAWINGS

FIG. 1 illustrates a cross-sectional view of a portion of a semiconductor component 100 after several initial stages of a manufacturing process. FIG. 1 illustrates a semiconductor substrate 110. In the preferred embodiment, substrate 110 includes an epitaxial layer 111 comprised of silicon and doped to have a first conductivity type. FIG. 1 also illustrates a portion of a bipolar transistor in component 100. The bipolar transistor can be electrically isolated from other transistors or devices in substrate 110 by using isolation techniques such as field isolation or trench isolation, as known in the art.

Trenches 113 are etched into epitaxial layer 111. Trenches define a plurality of pedestal structures or pedestals 112 in layer 111. In the preferred embodiment, trenches 113 have a depth of approximately 1 to 3 micrometers ($\mu$m). In the preferred embodiment where layer 111 is comprised of silicon, pedestals 112 are also comprised of silicon. Also in the preferred embodiment, trenches 113 do not extend into the non-epitaxial portion of substrate 110, but trenches 113 may extend into the nonepitaxial portion in an alternative embodiment. Portions of pedestals 112 serve as the collector region of the bipolar transistor in component 100. Accordingly, trenches 113 define the edges of the collector region.

Trenches 113 can be formed by disposing an oxide layer 120 over the top surface of layer 111. As used herein, the term "oxide layer" is a dielectric layer comprised of silicon oxide. As an example, an oxide layer can consist substantially of silicon dioxide that is thermally grown in an oxidation furnace or that is deposited by a chemical vapor deposition process. As another example, an oxide layer can consist substantially of tetra-ethyl-ortho-silicate (TEOS) or phosphosilicate glass that is deposited by a chemical vapor deposition process. In the preferred embodiment, oxide layer 120 is comprised of a silicon dioxide layer thermally grown to a thickness of approximately 0.01 to 0.1 $\mu$m. Next, a nitride layer 130 is disposed over oxide layer 120. As used herein, the term "nitride layer" is a dielectric layer comprised of silicon nitride. For example, a nitride layer can consist substantially of silicon nitride that is deposited by a chemical vapor deposition process. As another example, a nitride layer can consist substantially of silicon oxynitride that is also deposited by a chemical vapor deposition process. In the preferred embodiment, nitride layer 130 is comprised of a silicon nitride material deposited by a chemical vapor deposition process to a thickness of approximately 0.1 to 0.3 $\mu$m.

A patterned photoresist layer (not shown in FIG. 1) is formed over layer 130, and layers 130 and 120 are sequentially etched using conventional processes known in the art. After removal of the patterned photoresist layer, layer 111 is etched to form trenches 113 into the top surface of layer 111. Layers 130 and 120 serve as the etch mask during the formation of trenches 113. Trenches 113 are subsequently filled with an electrically insulative material 140. In the preferred embodiment, material 140 is comprised of a dielectric material such as, for example, an oxide layer of TEOS.

Figure 2:
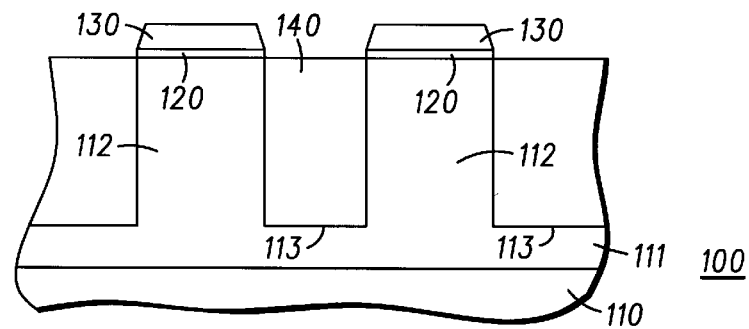
Figure 3:
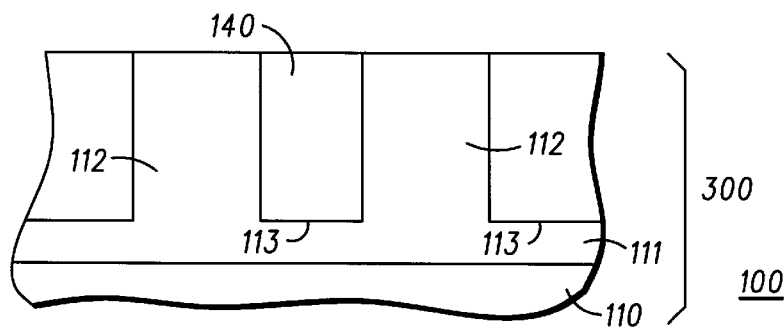

FIG. 2 illustrates a cross-sectional view of the portion of component 100 after subsequent stages of the manufacturing process. FIG. 2 depicts material 140 after being planarized. Next, FIG. 3 illustrates component 100 after the remaining portions of layers 130 and 120 are removed to provide a substantially planar surface. In the preferred embodiment, the planarization of material 140 and the removal of the remaining portions of layers 130 and 120 is preferably accomplished by depositing photoresist or any organic or inorganic leveling agent and etching back with equal etch rates for the leveling agent and material 140. The etching of material 140 is continued to expose layer 120. Then layers 130 and 120 are sequentially etched to form the preferred substantially planar surface illustrated in FIG. 3. Alternatively, a chemical-mechanical polishing process can be used for the planarization process. This planarization process forms a composite substrate 300 comprised of substrate 110, layer 111, pedestals 112, trenches 113, and material 140 in trenches 113. The top surface of composite substrate 300 is formed by adjacent portions of pedestals 112 and material 140 in trenches 113.

Figure 4:
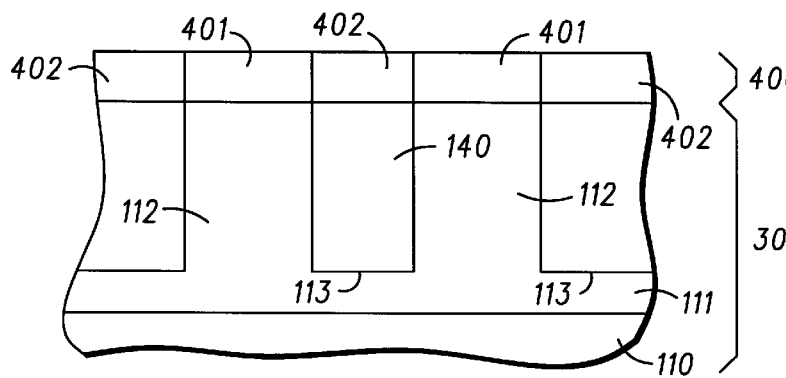

FIG. 4 illustrates a cross-sectional view of the portion of component 100 after further stages of the manufacturing process. An epitaxial layer 400 is disposed over the top surface of composite substrate 300. Layer 400 includes monocrystalline portions 401 and polycrystalline portions 402. Portions 401 are located directly over pedestals 112, and portions 402 are located directly over material 140 in trenches 113. Portions 401 of layer 400 are used to form the base region for the bipolar transistor in component 100. Portions 402 of layer 400 serve as the polysilicon base contact for the bipolar transistor of component 100.

In the preferred embodiment, layer 400 is thermally grown by an epitaxial process to simultaneously form portions 401 and 402 contiguous with each other and laterally adjacent to each other. In the preferred embodiment where layer 111 is comprised of a silicon epitaxial layer doped to have the first conductivity type, layer 400 is preferably comprised of a silicon epitaxial layer doped in-situ to have a second conductivity type different from the first conductivity type. The particular doping profile in layer 400 can be controlled to provide a reduced base transit time in component 100. In this preferred embodiment, one skilled in the art will understand that the different regions of underlying substrate 300 will predetermine the locations of portions 401 and 402 of layer 400. One skilled in the art will also understand that the substantially planar top surface of substrate 300 will produce portions 401 and 402 such that their top surfaces are coplanar with each other, forming a substantially planar top surface for layer 400. In this embodiment, the top surface of layer 400 is substantially parallel to the top surface of substrate 300.

Figure 5:
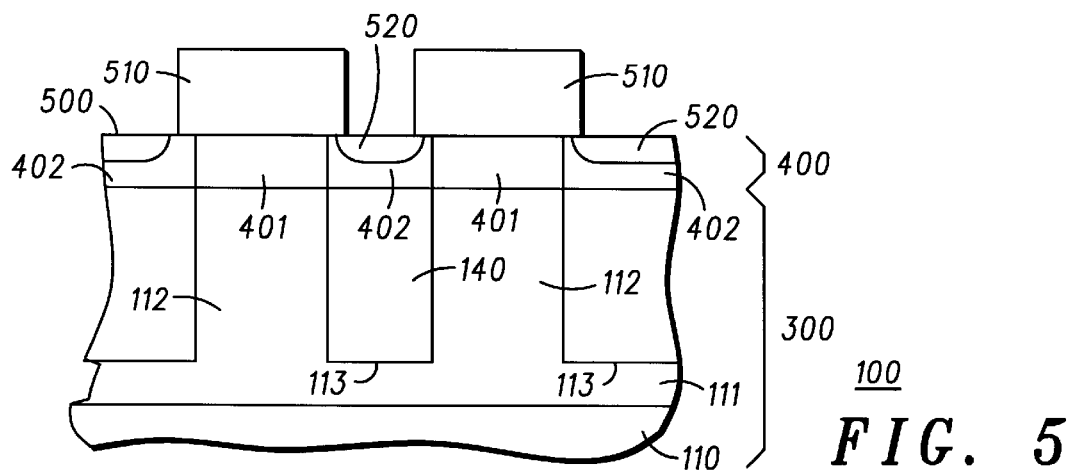

FIG. 5 illustrates a cross-sectional view of component 100 after still further stages of the manufacturing process. An oxide layer 500 is formed over the top surface of layer 400. In the preferred embodiment, layer 500 is a silicon dioxide layer thermally grown to a thickness of less than approximately 0.05 m. A patterned photoresist layer 510 is formed over layer 500. Layer 510 is aligned to expose portions 402 of layer 400 that underlie layer 500. Layer 510 is used to block the ions of an implantation process used to form regions 520 in portions 402 of layer 400. This selective doping process increases the doping concentration in portions 402 of layer 400 by preferably implanting a dopant of the same conductivity type that was originally used to dope layer 400 during its epitaxial growth. Layer 510 blocks the ions or dopants from being implanted into portions 401 of layer 400.

Figure 6:
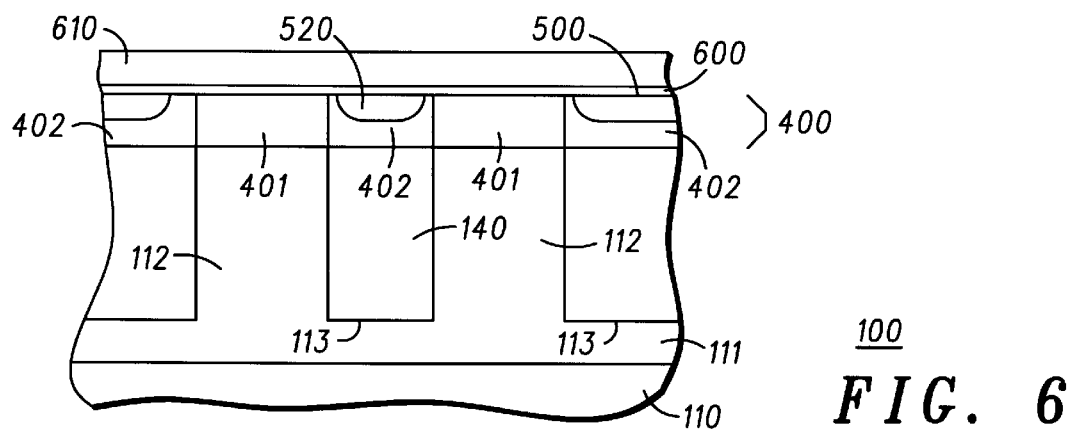

FIG. 6 illustrates a cross-sectional view of the portion of component 100 after yet further stages of the manufacturing process. Layer 510 of FIG. 5 is removed and layers 600 and 610 in FIG. 6 are sequentially disposed over layer 500 and the top surface of layer 400. In the preferred embodiment, layer 600 is an oxide layer, and layer 610 is a nitride layer.

Figure 7:
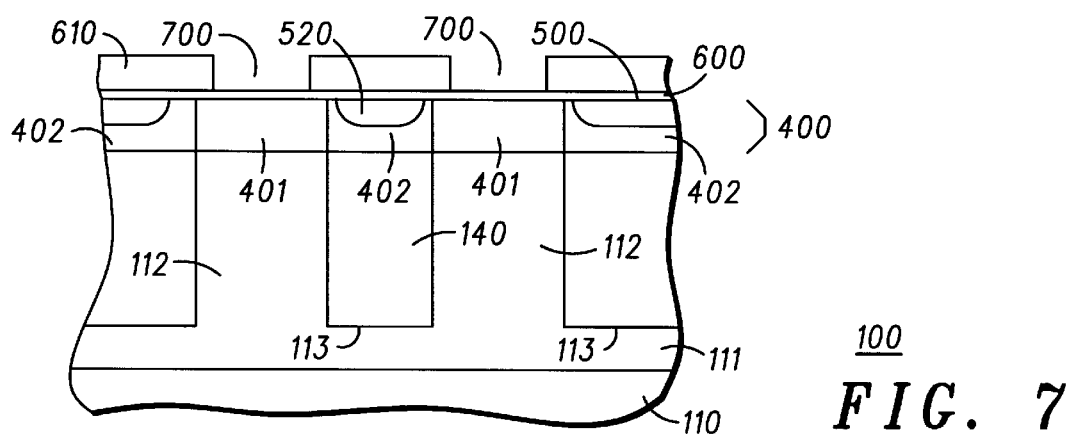
Figure 8:
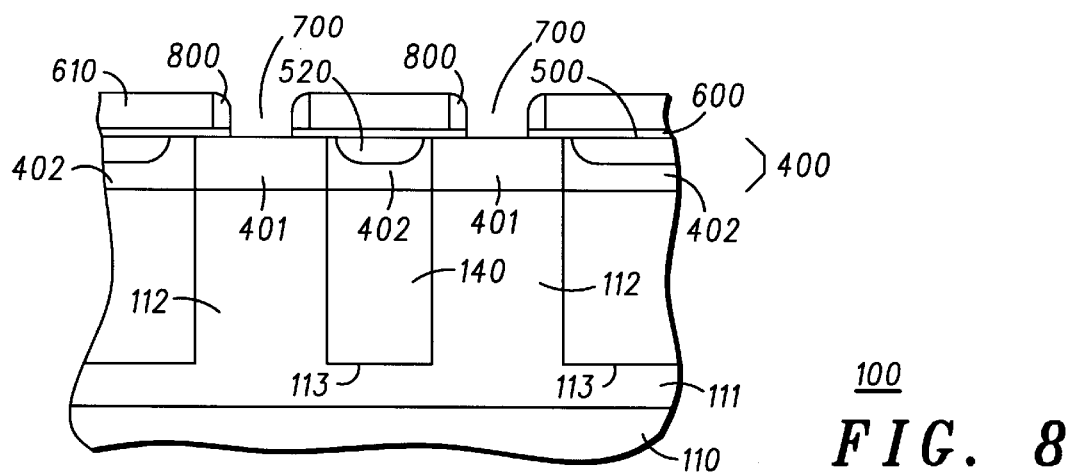

Next, in FIG. 7, holes 700 are etched into layer 610 using processes known in the art. Holes 700 form an emitter opening in which the emitter contact for the bipolar transistor in component 100 is subsequently formed. Turning to FIG. 8, spacers 800 are formed in holes 700 by first depositing a layer of material over layer 610 and in holes 700 and then isotropically etching that layer of material. In the preferred embodiment, spacers 800 are comprised of polycrystalline silicon. Spacers 800 and the remaining portions of layers 610 are used as an etch mask to extend holes 700 through underlying layer 600. Thus, holes 700 now expose portions 401 of layer 400. Spacers 800 can also reduce the size of holes 700 to below photolithographic dimensions. The sub-lithographic sizes of holes 700 reduce the sizes of subsequently formed emitters.

Figure 9:
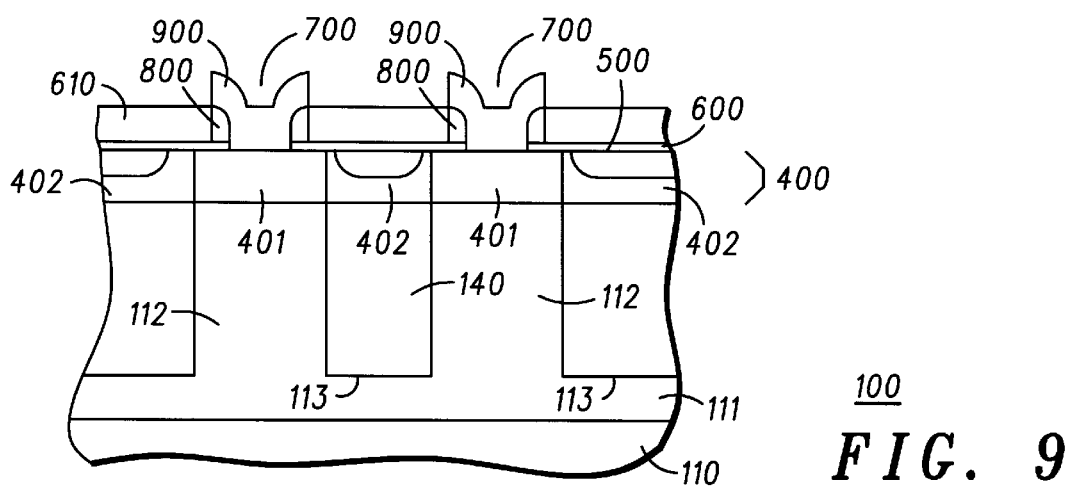

FIG. 9 illustrates a cross-sectional view of the portion of component 100 after additional stages of the manufacturing process. Emitter contacts 900 are formed in holes 700. In the preferred embodiment, contacts 900 are comprised of polycrystalline silicon (polysilicon). Also, the polysilicon of contacts 900 is doped with a dopant having a conductivity type similar to that of layer 111 and different from that of portions 401 and 402 and region 520 in layer 400. As an example, contacts 900 and layer 111 can be P-type, and layer 400 can be N-type.

Figure 10:
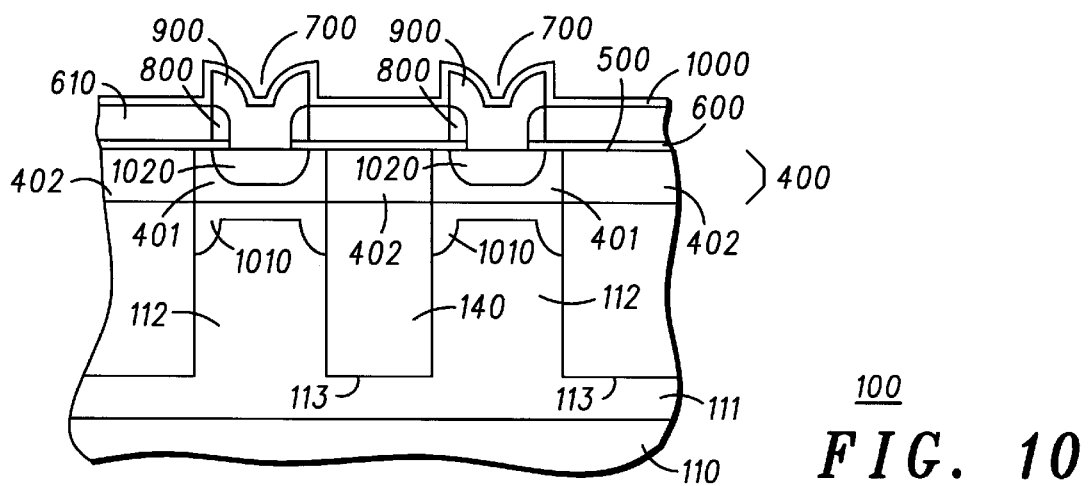

FIG. 10 illustrates a cross-sectional view of the portion of component 100 after several more stages of the manufacturing process. A capping layer 1000 is disposed over layer 610 and contacts 900. Layer 1000 serves as a diffusion barrier during a subsequent anneal. In the preferred embodiment, layer 1000 is comprised of a silicon nitride material. Component 100 is subsequently annealed to simultaneously form portions 1010 and region 1020 in pedestals 112. Portions 1010 form an enhanced base region for the bipolar transistor in component 100, and regions 1020 form emitter regions for the bipolar transistor in component 100. The high temperature anneal diffuses the dopant out of contacts 900 and into the underlying portions 401 of layer 400. Furthermore, the regions 520 (FIG. 9) in portions 402 of layer 400 are uniformly diffused throughout portions 402 during the high temperature anneal. The dopant in region 520 is also diffused out of portions 402 and into portions 401 of layer 400 and also into the underlying pedestals 112 of layer 111. Due to the arrangement of portions 401 and 402 in layer 400, it is noted that portions 1010 will be located at the edges of the base regions and that the edges of the base regions will extend further into pedestals 112 than the central portions of the base regions.

Figure 11:
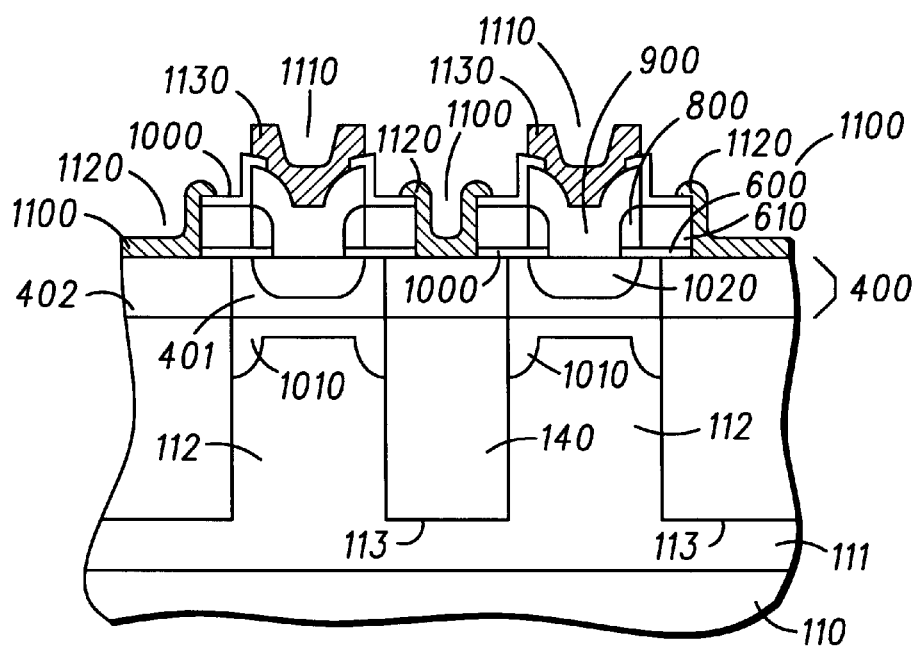

FIG. 11 illustrates a cross-sectional view of the portion of component 100 after various additional stages of the manufacturing process. Layers 1000 and 610 are patterned with holes 1110 and 1100 to expose portions of contacts 900 and portions 402 of layer 400, respectively. Subsequently, metallic contacts 1130 and 1120 are simultaneously formed over contacts 900 and portion 402 of layer 400, respectively. Contacts 1130 form an additional portion of the emitter contacts for the bipolar transistor in component 100, and contacts 1120 form an additional portion of the base contacts for the bipolar transistor in component 100. One skilled in the art will understand that contacts 1120 and 1130 can include, among other features, a silicide layer, a barrier layer, a seed layer, and a thick conducting layer.

Therefore an improved semiconductor component and its method of manufacture is provided to overcome the disadvantages of the prior art. The semiconductor component is capable of operating efficiently at high frequencies because the bipolar transistors of the component have reduced base transit times, lower intrinsic base resistances, and smaller and more linear extrinsic base to collector capacitances when compared to the prior art. The reduced base transmit time is achieved by engineering the doping profile in portion 401 of layer 400. The lower intrinsic base resistances are provided by enhancing the doping in portions 402 of layer 400 and by locating portions 1010 closer to emitter regions 1020. As mentioned earlier, portions 402 serve as the base contact for the bipolar transistor. The base-to-collector capacitance is smaller and more linear compared to the prior art because of the use of pedestals 112 and trenches 113 and because of material 140 in trenches 113.

Although the invention has been described with reference to specific embodiments, it will be understood by those skilled in the art that various changes and modifications may be made without departing from the spirit or scope of the present invention. For instance, the numerous details set forth herein such as, for example, the material compositions and thicknesses are provided to facilitate the understanding of the present invention and are not provided to limit the scope of the present invention. Additionally, the concepts disclosed herein can be applied to a heterostructure bipolar transistor (HBT) such as, for example, a silicon germanium HBT.

Accordingly, the disclosure of the present invention is not intended to be limiting. Instead, the disclosure of the present invention is intended to be illustrative of the scope of the present invention. It is intended that the scope of the present invention shall be limited only to the extent required by the appended claims and the rules and principles of applicable law.

What is claimed is:

1. A method of manufacturing a semiconductor component comprising:
    providing a composite substrate with a dielectric portion and a semiconductor portion having a first conductivity type; and
    growing an epitaxial layer over the composite substrate wherein the epitaxial layer has a polycrystalline portion over the dielectric portion of the composite substrate and has a monocrystalline portion over the semiconductor portion of the composite substrate wherein the monocrystalline portion has a second conductivity type different from the first conductivity type and forms a base region for a bipolar transistor.

2. The method of claim 1 wherein providing the composite substrate further comprises:
    providing a semiconductor substrate and an other epitaxial layer over the semiconductor substrate,
    wherein the other epitaxial layer forms the semiconductor portion of the composite substrate.

3. The method of claim 1 wherein providing the substrate further comprises:
    providing a semiconductor substrate having a pedestal structure and a recess wherein the recess defines the pedestal structure and wherein the pedestal structure forms the semiconductor portion of the composite substrate; and
    filling the recess with an electrically insulative material to provide the dielectric portion of the composite substrate.

4. The method of claim 1 wherein growing the epitaxial layer further comprises:
    growing a doped semiconductor epitaxial layer,
    wherein the polycrystalline portion of the epitaxial layer has the second conductivity type.

5. The method of claim 1 further comprising:
    diffusing a first dopant into the monocrystalline portion of the epitaxial layer to form an emitter region in the monocrystalline portion of the epitaxial layer; and
    diffusing a second dopant into the monocrystalline portion of the epitaxial layer to form an enhanced portion of the base region,
    wherein the second dopant has the second conductivity type and wherein the first dopant has the first conductivity type.

6. The method of claim 5 further comprising:
    implanting the second dopant into the polycrystalline portion of the epitaxial layer while blocking the second dopant from the monocrystalline portion of the epitaxial layer.

7. The method of claim 6 further comprising:
    diffusing the second dopant from the polycrystalline portion of the epitaxial layer into the monocrystalline portion of the epitaxial layer.

8. The method of claim 7 further comprising:
    diffusing the second dopant from the monocrystalline portion of the epitaxial layer into the semiconductor portion of the substrate.

9. The method of claim 5 further comprising:
    forming a polycrystalline emitter contact over the monocrystalline portion of the epitaxial layer,
    wherein the polycrystalline emitter contact has the first dopant.

10. The method of claim 9 further comprising:
    diffusing the first dopant from the polycrystalline emitter contact into the monocrystalline portion of the epitaxial layer.

11. The method of claim 9 further comprising:
    depositing a dielectric layer over the epitaxial layer; and
    etching a hole in the dielectric layer to expose a portion of the monocrystalline portion of the epitaxial layer,
    wherein forming the polycrystalline emitter contact further comprises forming the polycrystalline emitter contact in the hole in the dielectric layer.

12. The method of claim 11 further comprising:
    forming a spacer in the hole in the dielectric layer; and
    keeping the spacer in the hole while forming the polycrystalline emitter contact in the hole.

13. The method of claim 5 further comprising:
    diffusing the second dopant from the monocrystalline portion of the epitaxial layer into the semiconductor portion of the substrate.

14. The method of claim 1 further comprising:
    providing the substrate with a substantially planar surface, and
    wherein growing the epitaxial layer further comprises growing the epitaxial layer to have a substantially planar surface substantially parallel to the substantially planar surface of the substrate.

15. A method of manufacturing a semiconductor component comprising:
    providing a composite substrate with a top surface and having a first conductivity type;
    etching trenches into the top surface of the composite substrate to define a plurality of silicon pedestals in the top surface of the composite substrate;
    filling the trenches with an oxide;
    simultaneously growing a monocrystalline silicon portion of an epitaxial layer over the plurality of silicon pedestals while growing a polycrystalline silicon portion of the epitaxial layer over the oxide in the trenches wherein the monocrystalline and polycrystalline silicon portions of the epitaxial layer have a second conductivity type different from the first conductivity type, wherein the monocrystalline and polycrystalline silicon portions of the epitaxial layers are contiguous with each other, and wherein the monocrystalline silicon portion of the epitaxial layer forms a base region for a transistor;
    selectively doping the polycrystalline silicon portion of the epitaxial layer with a first dopant of the second conductivity type after simultaneously growing the monocrystalline portion of the silicon epitaxial layer and the polycrystalline silicon portion of the epitaxial layer;

forming a polycrystalline silicon emitter contact over and contiguous with the monocrystalline silicon portion of the epitaxial layer, the polycrystalline silicon emitter contact having a second dopant of the first conductivity type;

annealing the semiconductor component to diffuse the second dopant from the polycrystalline silicon emitter contact into the monocrystalline silicon portion of the epitaxial layer to form an emitter region in the monocrystalline portion of the silicon epitaxial layer and to simultaneously diffuse the first dopant from the polycrystalline portion of the silicon epitaxial layer into the monocrystalline silicon portion of the epitaxial layer to extend the base region into the plurality of silicon pedestals; and simultaneously forming a metallic emitter contact over the polycrystalline silicon emitter contact and a metallic base contact over the polycrystalline silicon portion of the epitaxial layer.

16. The method of claim 15 wherein annealing the semiconductor component further comprises:

diffusing the first dopant from the polycrystalline silicon epitaxial layer into the monocrystalline silicon epitaxial layer to extend edge portions of the base region further into the plurality of silicon pedestals than a central portion of the base region.

17. The method of claim 15 further comprising:

planarizing the oxide to provide a substantially planar surface comprised of the oxide and the plurality of silicon pedestals.

18. The method of claim 17 wherein the simultaneously growing step further comprises:

providing the monocrystalline silicon portion of the epitaxial layer with a top surface substantially coplanar with a top surface of the polycrystalline silicon portion of the epitaxial layer, wherein the top surfaces of the monocrystalline and polycrystalline silicon portions of the epitaxial layer are substantially parallel to the substantially planar surface of the oxide and the plurality of silicon pedestals.

* * * * *